(12) United States Patent
Tan

(10) Patent No.: US 6,244,874 B1
(45) Date of Patent: Jun. 12, 2001

(54) ELECTRICAL CONTACTOR FOR TESTING INTEGRATED CIRCUIT DEVICES

(76) Inventor: Yin Leong Tan, Blk. 22, St. George's Road, #25-182, Singapore (SG), 321022

(*) Notice: Subject to any disclaimer, the term of this patent is extended or adjusted under 35 U.S.C. 154(b) by 0 days.

(21) Appl. No.: 09/508,194

(22) Filed: Mar. 8, 2000

(30) Foreign Application Priority Data

Sep. 16, 1997 (SG) .................................................. 9703426-8

(51) Int. Cl.⁷ .................................................. H01R 9/09
(52) U.S. Cl. .................................................. 439/66; 439/70
(58) Field of Search .................................. 439/66, 68, 69, 439/70, 71, 74, 591

(56) References Cited

U.S. PATENT DOCUMENTS

| | | | | |
|---|---|---|---|---|
| 4,494,807 | * | 1/1985 | Cosmo | 339/17 CF |
| 5,069,629 | * | 12/1991 | Johnson | 439/71 |
| 5,199,889 | * | 4/1993 | McDevitt, Jr. | 439/66 |
| 5,207,584 | * | 5/1993 | Johnson | 439/66 |
| 5,437,556 | * | 8/1995 | Bargain et al. | 439/66 |
| 5,594,355 | * | 1/1997 | Ludwig | 324/755 |
| 5,634,801 | * | 6/1997 | Johnson | 439/71 |
| 5,749,738 | * | 5/1998 | Johnson et al. | 439/66 |

* cited by examiner

*Primary Examiner*—Brian Sircus
*Assistant Examiner*—Michael E. Carroll
(74) *Attorney, Agent, or Firm*—Lawrence Y. D. Ho & Associates; Jon A. Gibbons

(57) ABSTRACT

An electrical contact for IC device (31) testing which provides good electrical contact without involving wiping action. This electrical contact comprises a first and second arm (40, 44) formed into a generally C-shaped segment and a hook segment (46) which protrudes from the C-shaped segment in a direction generally opposite the second arm (44). The first and the second is connected via a resilient neck (42). This contact can be adapted for use with an apparatus for electrically interconnecting a lead (33) of a test device to a terminal spaced at a distance from the lead.

4 Claims, 3 Drawing Sheets

ELECTRICAL CONTACTOR FOR TESTING INTEGRATED CIRCUIT DEVICES

FIELD OF THE INVENTION

The present invention relates to electrical interconnections in general. In particular, it relates to the interconnection of the leads of an integrated circuit device with a printed circuit board used in performance testing.

BACKGROUND OF THE INVENTION

Many designs for effecting the interconnection between leads of an integrated circuit (IC) device and a printed circuit board have been described for performance evaluation of the IC device. In particular, U. S. Pat. No. 5,207,584 discloses an electrical interconnect contact system having a housing with generally z or s-shaped planar contacts. Troughs are provided along the two surfaces of the housing with securing elements seated inside the troughs. The s-shaped contacts are mounted in slots cut across the housing, with the two hooks of the s-shape each engaging one securing element, and the two ends of the contacts exposed one on each surface. The leads of the IC device for testing would be in contact with s-shaped contact from one surface, and a pad or terminal of a printed circuit board in contact with the s-shaped contact or probe from the other surface. At least one of the securing elements is elastomeric to facilitate a wiping action by which contact with the lead of the IC and the pad of the printed circuit board are effected. This wiping action, although providing effective contact during initial use, has been found to cause an unacceptably high rate of wearing of the connecting pad on the printed circuit board. Since the printed circuit board is very costly, it is not economically viable to change the board frequently. In addition, because the elastomeric elements such as elastomeric bands used to allow this wiping action has to be of sufficient laxity to allow lateral movement to effect wiping, they wear out quickly, requiring time-consuming and costly replacements. There is therefore a need to design a new electrical contact to overcome the problems stated above.

OBJECT OF THE INVENTION

It is one object of the present invention to provide an electrical contact which produces reduced wearing when used with an electrical interconnect contact system.

It is another object to provide an electrical contact which allow reliable electrical connection.

SUMMARY OF THE INVENTION

The present invention is an novel electrical contact for IC device testing. This electrical contact provides good contact with the lead of a test IC device without involving wiping action. This electrical contact comprises a first and second arm formed into a generally C-shaped segment and a hook segment which protrudes from the C-shape segment in a direction generally opposite the second arm. The first and the second arms are connected via a resilient neck. The preferred embodiment is a planar metallic pin having the general shape of the Greek alphabet Tau (τ), and is adapted for use with an apparatus for electrically interconnecting a lead of a test device to a terminal spaced at a distanced from the lead. The apparatus has a housing interposed between the lead and the terminal, with at least one contact receiving slot formed therein. This slot extends substantially parallel to an axis extending between a corresponding lead and a terminal. The housing also comprises oppositely facing first and second surfaces. The first surface proximate the lead, and the second surface proximate the terminal. The second surface having a trough formed therein proximate the terminal. A resilient element is received in the trough. The contact according to the preferred embodiment is received in the slot with the first arm protruding from the first surface, and adapted for effective contact with the test lead. The second arm protrudes from the second surface and is adapted for contact with the terminal. The hook segment protrudes from said C-shape segment in a direction generally opposite the second arm, and is adapted to receive the securing element such that the hook segment is pressed into contact with the terminal, such that testing the IC device is accomplished without wiping action.

DETAILED DESCRIPTION OF THE INVENTION

The present invention is a novel contactor or contact pin adapted for used with an electrical interconnect contact system. This contact pin gives good connection with the IC device under test, and also connects well with the printed circuit board used for testing without the need for wiping action.

Figure 1:
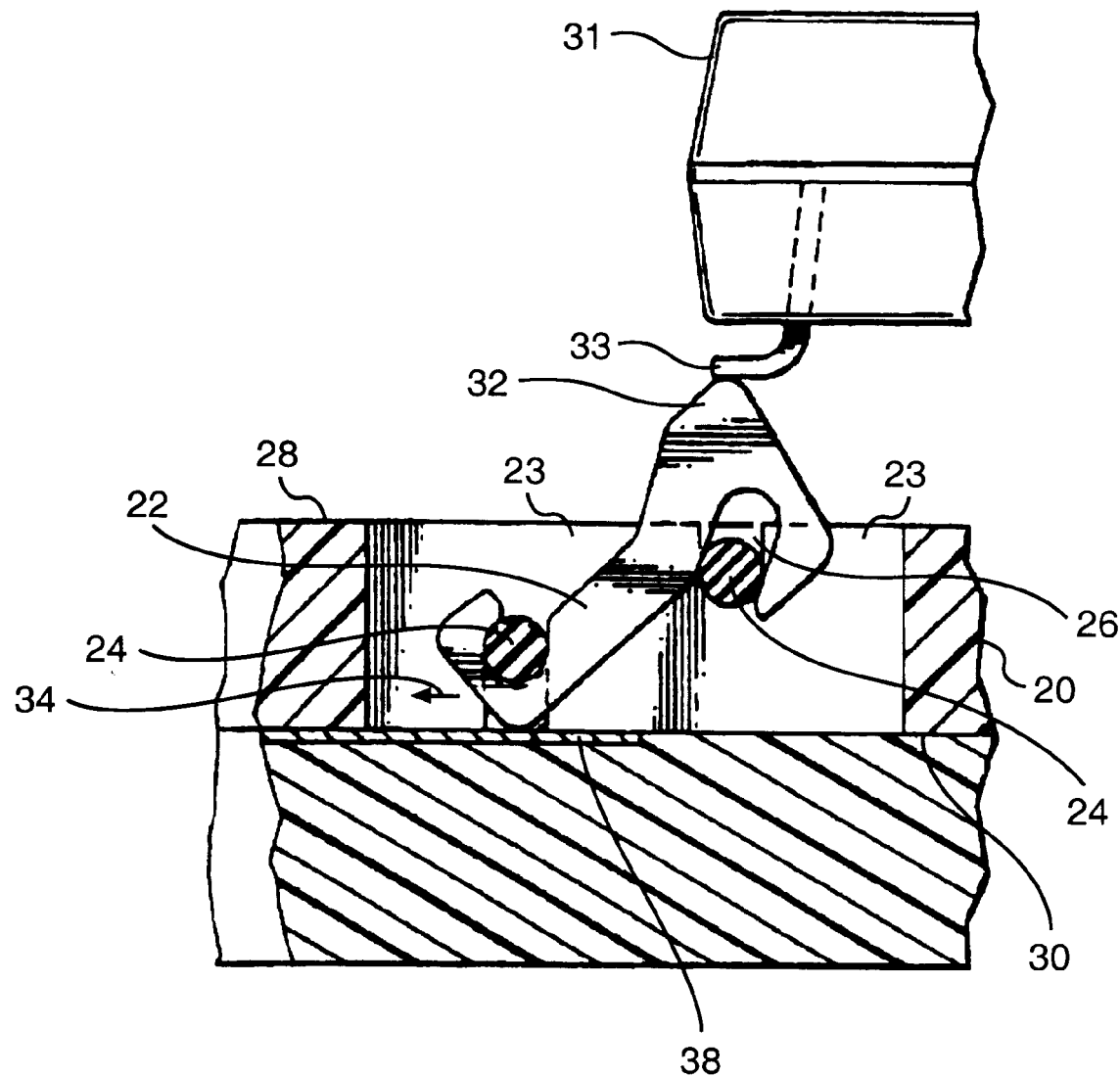
FIG. 1 is a front cross-sectional view of a electrical interconnect contact system in the prior art.

FIG. 1 shows an interconnect system as found in the prior art, as found in U.S. Pat. No. 5,207,584. In this system, the housing 20 has slots 23 in which s-shaped planar contacts 22 are inserted. These contacts are secured by elastomeric elements 24 which are received in two troughs 26 (indicated by the dotted lines), one on the top surface 28 and one on the bottom surface 30 of the housing. The top surface proximates the IC device under test, and the bottom surface proximates the printed circuit board. The elastomeric elements allow the s-shaped contact pin to slide when the lead of the IC device under test is pressed onto protrusion 32, causing a wiping action in the direction of arrow 34. Although this system provides good electrical contact, it has undesirable results discussed previously.

Figure 2B:
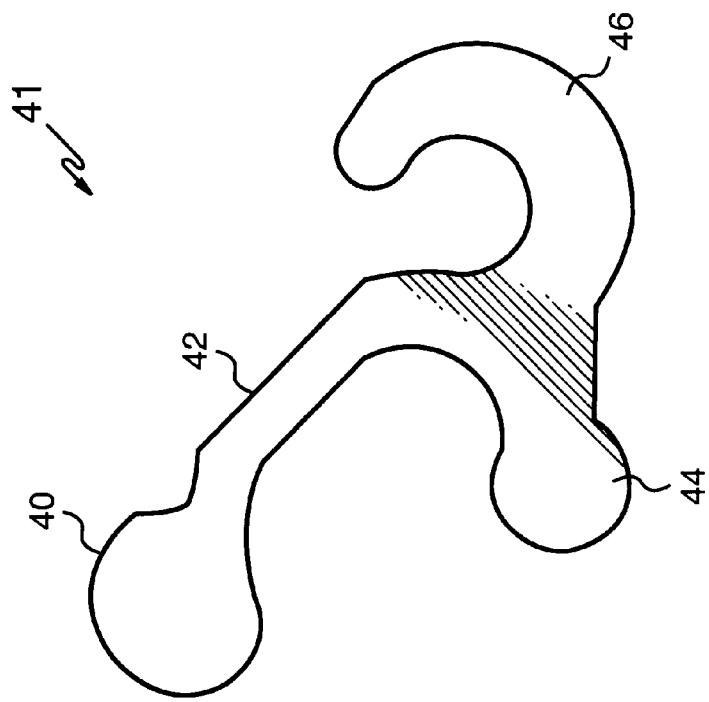
FIG. 2 is a side plan view of an electrical contact in the prior art (2A) and according to the present invention (2B).
Figure 2A:
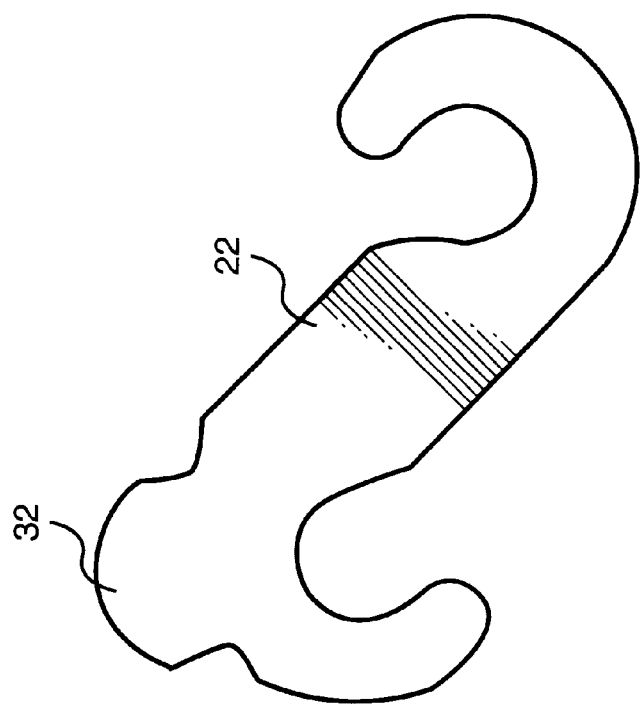

The neatest solution to the problem is to provide a springy element on the first end of the pin in contact with the IC device under test, but preventing the springy displacement caused by the caused by this contact from being translated to the second end of the pin in contact with the printed circuit board. This requires the complete redesigning of the contact pin to provide good electrical contact without a wiping action. FIG. 2B shows an embodiment of the present invention as compared to another contact pin in the prior art (2A). This planar tau-shaped contact pin 41 comprises three segments, which serves three different functions. The first segment is an arm which is the contact for the lead of the IC under test. This first arm has a head 40 adapted for good electrical contact, and is connected to the rest of the contact pin by a springy or resilient neck 42. The shape of the neck 42 is preferably slightly bent to allow the head 40 to be pressed down by the IC device. The second segment is a second arm 44, which preferably runs substantially normal to an axis along which the IC device presses onto the head of the first arm 40. The function of this arm is to act as a brake to prevent the entire contact pin 41 from shifting while being pressed by the IC device. The first and second arm together form into approximately a C-shape. The third segment of the contact pin extends in a direction generally opposite to the second arm, and is preferably formed into a hook 46 for engagement with a securing element as described below.

Figure 3:
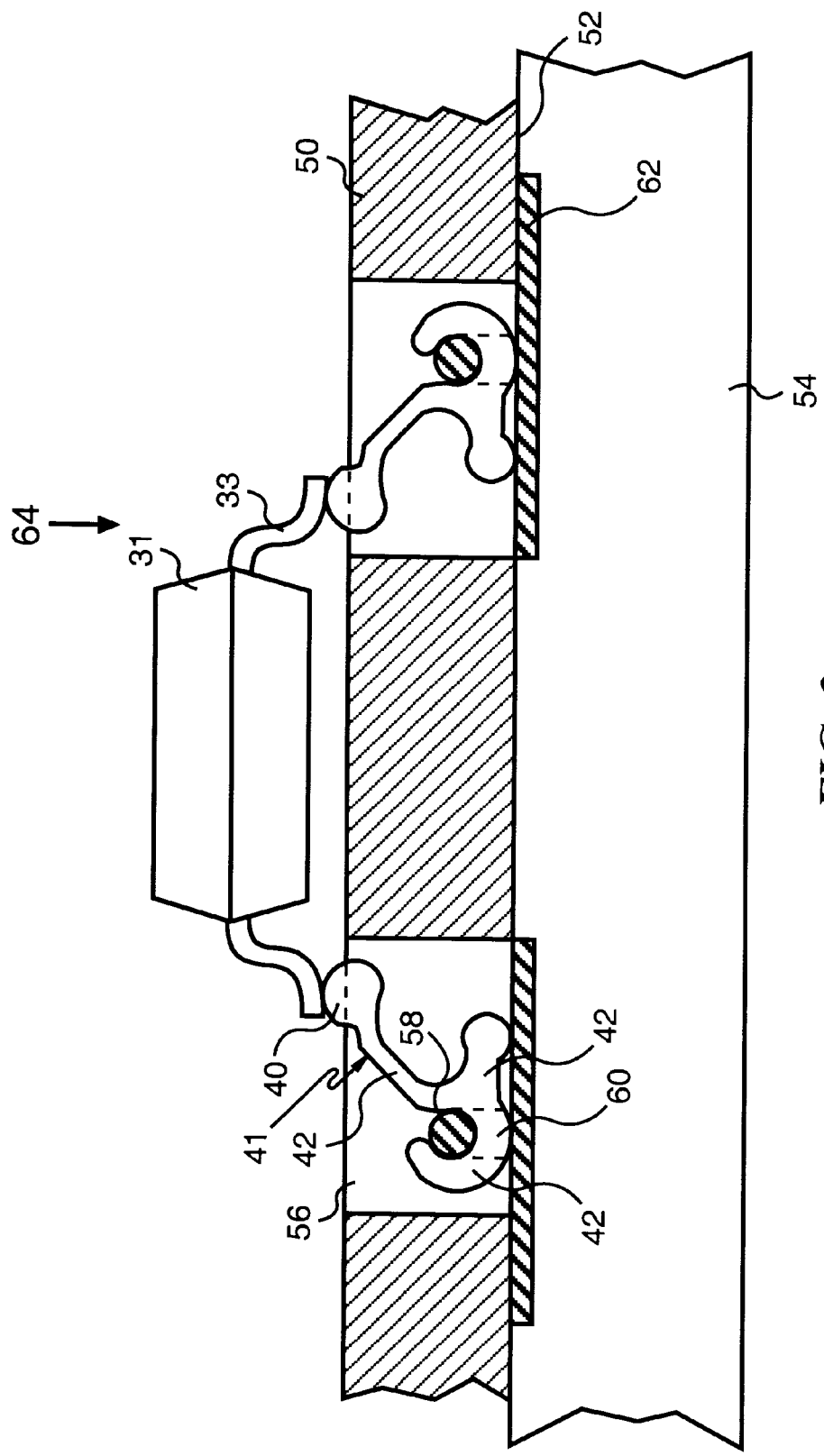
FIG. 3 is a front cross-sectional view of the interconnect contact system according to the present invention, with the left side of the drawing showing the system in a resting position, and the right side of the drawing showing the system in a testing position.

FIG. 3 shows how the tau-shaped contact pin 41 of the present invention is fitted into a conventional housing having a top surface 50 and a bottom surface 52, with the bottom surface of the housing in contact with a printed curcuit board 54. For proper electrical connection, the tau-shaped pin 41 is secured into slot 56 containing a securing element 58 received in the trough 60 of the bottom surface 52 which proximates the printed circuit board. This securing element 58 according to the present invention is preferably made of a resilient and deformable material, such as high density rubber. Unlike the prior art elastomeric element which provides a measure of compressibility and tensile extendibility, the resilient element of the present invention should only give a small measure of compressibility with minimized extendability. This allows for easy installment of the contact pins, and also causes the contact pins to be securely and firmly pressed towards the contact pad 62 of the printed circuit board 54 once the system is properly installed, without allowing further lateral movement caused during testing.

FIG. 3 also shows how the contact pin 41 according to the present invention is used for IC testing. The left half of the drawing shows the lead 33 of an IC device 31 in contact with the tau-shaped pin 41 in the resting position. The right half of the drawing shows the IC device in contact with the pin 41 in the testing position. In the resting position, the head of the first arm 40 protrudes from top surface 50 of the housing. During testing, the lead 33 of the IC device 31 under test is pressed downwards as shown by arrow 64 to ensure a good electrical contact. This causes the neck 42 of the first arm of the tau-shaped contact pin 41 to bend in order for the head to move downwards. Due to the presence of the second arm which extends substantially normal to the axis of the compressing force 64, the contact pin 41 is prevented from shifting. The contact is further stabilized by the hook segment 46, which is resiliently pressed onto the pad of the printed circuit board by the securing element. Thus the combination of the second arm and hook segment 46 provides good electrical contact without wiping action, minimizing wear and tear without compromising on the quality of the test circuit.

While the present invention has been described particularly with references to FIGS. 2B and 3, it should be understood that the figures are for illustration only and should not be taken as limitation on the invention. It is contemplated that many changes and modifications may be made by one of ordinary skill in the art without departing from the spirit and the scope of the invention described.

What is claimed is:

1. A contact pin for electrical connection comprising:

a body having a first arm and a second arm, said first arm including a head and a neck, said head adapted for contact with a lead of a test IC device; said second arm adapted for connection with a testing terminal, and further acting as a brake against wiping, said first and second arms forming generally into a C-shape; and a hook segment extending from said body in a direction generally opposite to the second arm and adapted for engagement with a securing element, wherein said contact pin has a generally planar and tau-shaped configuration.

2. A contact pin according to claim 1, wherein said neck has a measure of resilience for biasing said head towards said lead.

3. An apparatus for electrically interconnecting a lead of a test device to a terminal spaced at a distance from the lead, said apparatus having a housing interposed between the lead and said terminal, said housing having at least one contact receiving slot formed therein, said slot extending substantially parallel to an axis extending between a corresponding lead and said terminal, said housing further having oppositely facing first and second surfaces, said first surface proximate said lead and said second surface proximate the spaced terminal, said second surface having a trough formed therein proximate said terminal and traversing said slot, characterized in that a resilient element is received in said trough;

a metallic contact pin is received in said slot, said contact pin having a first arm, a second arm and a hook segment;

said first arm having a head protruding from said first surface adapted for effective contact with said lead, said second arm extending towards said second surface and adapted for electrical contact with said terminal, said first and second arm forming generally into a C-shape, such that lateral movement of the contact pin due to the downward pressure on said first arm by said lead under testing is prevented;

said hook segment extending in a direction generally opposite to that of the second arm, said hook segment adapted to receive said resilient element such that said hook segment is pressed into fixed contact with said terminal when properly installed, wherein said contact pin has a generally planar and tau-shaped configuration, and whereby testing of IC device is accomplished effectively without wiping action.

4. An apparatus according to claim 3, wherein said head is connected to said second arm and a hook segment via a neck, said neck having a measure of resilience for biasing said head towards said lead.

* * * * *